(12) United States Patent
Chang et al.

(10) Patent No.: US 12,362,323 B2
(45) Date of Patent: Jul. 15, 2025

(54) THREE-DIMENSIONAL INTEGRATED CIRCUIT

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW); Chien-Chang Lee, Miaoli County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 315 days.

(21) Appl. No.: 17/460,181

(22) Filed: Aug. 28, 2021

(65) Prior Publication Data

US 2023/0060265 A1 Mar. 2, 2023

(51) Int. Cl.
*H01L 23/00* (2006.01)
*H01L 23/538* (2006.01)
*H01L 25/065* (2023.01)

(52) U.S. Cl.
CPC ...... *H01L 25/0657* (2013.01); *H01L 23/5384* (2013.01); *H01L 23/5385* (2013.01); *H01L 23/5386* (2013.01)

(58) Field of Classification Search
CPC ............. H01L 25/0657; H01L 23/5384; H01L 23/5385; H01L 23/5386
See application file for complete search history.

(56) References Cited

U.S. PATENT DOCUMENTS

| 11,515,290 | B2* | 11/2022 | Choi | H01L 25/50 |
| 2017/0054039 | A1 | 2/2017 | Gong et al. | |
| 2019/0385977 | A1* | 12/2019 | Elsherbini | H01L 25/50 |
| 2020/0381405 | A1* | 12/2020 | Patil | H01L 23/50 |
| 2020/0411445 | A1 | 12/2020 | Chen et al. | |
| 2021/0242117 | A1 | 8/2021 | Hung et al. | |
| 2022/0293526 | A1* | 9/2022 | Liao | H01L 25/0655 |

OTHER PUBLICATIONS

TW Patent and Trademark Office; TW Application No. 111107572; Office Action mailed Mar. 20, 2025; 8 pages.

* cited by examiner

*Primary Examiner* — Trang Q Tran
(74) *Attorney, Agent, or Firm* — The Marbury Law Group, PLLC (57) ABSTRACT

A die stack includes: a first die including a first semiconductor substrate; a first redistribution layer (RDL) structure disposed on a front surface of the first die and electrically connected to the first semiconductor substrate; a second die bonded to the front surface of the first die and including a second semiconductor substrate; a third die bonded to the front surface of the first die and including a third semiconductor substrate; a second RDL structure disposed on front surfaces of the second and third dies and electrically connected to the second and third semiconductor substrates; and a through dielectric via (TDV) structure extending between the second and third dies and electrically connected to the first RDL structure and second RDL structure. The second and third dies are disposed in a plane that extends perpendicular to a vertical stacking direction of the die stack.

20 Claims, 6 Drawing Sheets

FIG. 5B

THREE-DIMENSIONAL INTEGRATED CIRCUIT

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth due to the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Embodiments of the present disclosure are directed to a base/interconnection device die and to interconnection structures with additional dies connected therewith, such as a system on integrated chip (SoIC) packaging design.

The massive scale of modern data, such as analytics data or AI programming, easily overwhelms memory and computation resources on computational servers. For example, deriving meaningful insights from big data requires rich analytics. The big data and AI sectors demand ever increasing throughput to extraordinary large volumes of data. This is true both with respect to the exponential rise in the volume of data itself and to the increasing number and complexity of formats of data that such platforms must manage. AI and big data chipsets today are required to manage not just relational data, but also text, video, image, emails, social network feeds, real time data streams, sensor data, etc.

Embodiments of the present disclosure include an interconnection device die and SoIC architecture that addresses such demands and design parameters. Embodiments disclosed herein are provided to reduce the distance between processors and memories, increase the number of device-to-device ("D2D") connections in the packaging, and provide high bandwidth ("HB") memory capable of meeting the increasing demands with respect to memory access and bandwidth, real time processing and data delivery, and reduced power consumption.

A device die is provided as an interconnection device die (also referred to herein as a "base die" or "interconnection die"). The interconnection device die provides a structure on which other device dies, e.g., integrated circuit dies, such as SOICs, 3DICs, processors, or the like can be supported and interconnected.

An integrated fan out ("InFO") structure may include a circuit that provides connectivity between dies in a compact design. The InFO structure may include at least one redistribution layer (RDL) structure embedded in at least one insulating encapsulation of a device die, where the redistribution circuit structure includes one or more conductors electrically connected to conductive terminals arranged on a surface of the device die.

A SoIC structure may include active dies stacked one on top of another. The active dies may be interconnected vertically using through-silicon via ("TSV") structures. A SoIC structure may be a three-dimensional integrated circuit ("3DIC"). For example, a 3DIC may include a stack of similar active dies, such as a stack of memory dies with a controller logic on a separate die (e.g., a bottom die). In some embodiments, the 3DIC may include a stack of different dies. The dies may be stacked face to back (F2B), one on top of the other, with their active areas facing downwards or upwards. In some embodiments, the lower die may include metallization on a back surface of a substrate, and electrical connectors such as metal bumps, that may be used to connect the top die to this metallization. TSV structures may pass through the lower die's substrate and connect the metal bumps on the top die, via the back-side metallization, to the active area of the second die. In some embodiments, the dies may be stacked face to face (F2F). In such embodiments, the active areas of the lower die and the upper die face each other with electrical connectors providing connectivity between the opposing dies. In a F2F structure, a TSV structure may pass through one die, such as the lower die, and metallization or redistribution circuit may be formed on the back thereof to provide connection to components of the package.

The SoIC architecture may be electrically coupled to other device dies, such as one or more memories and/or processors. The memory may store one or more instructions. The processor may execute the one or more instructions. The one or more instructions, when executed by the processor, may configure the processor to perform data analysis and search queries.

Figure 1:
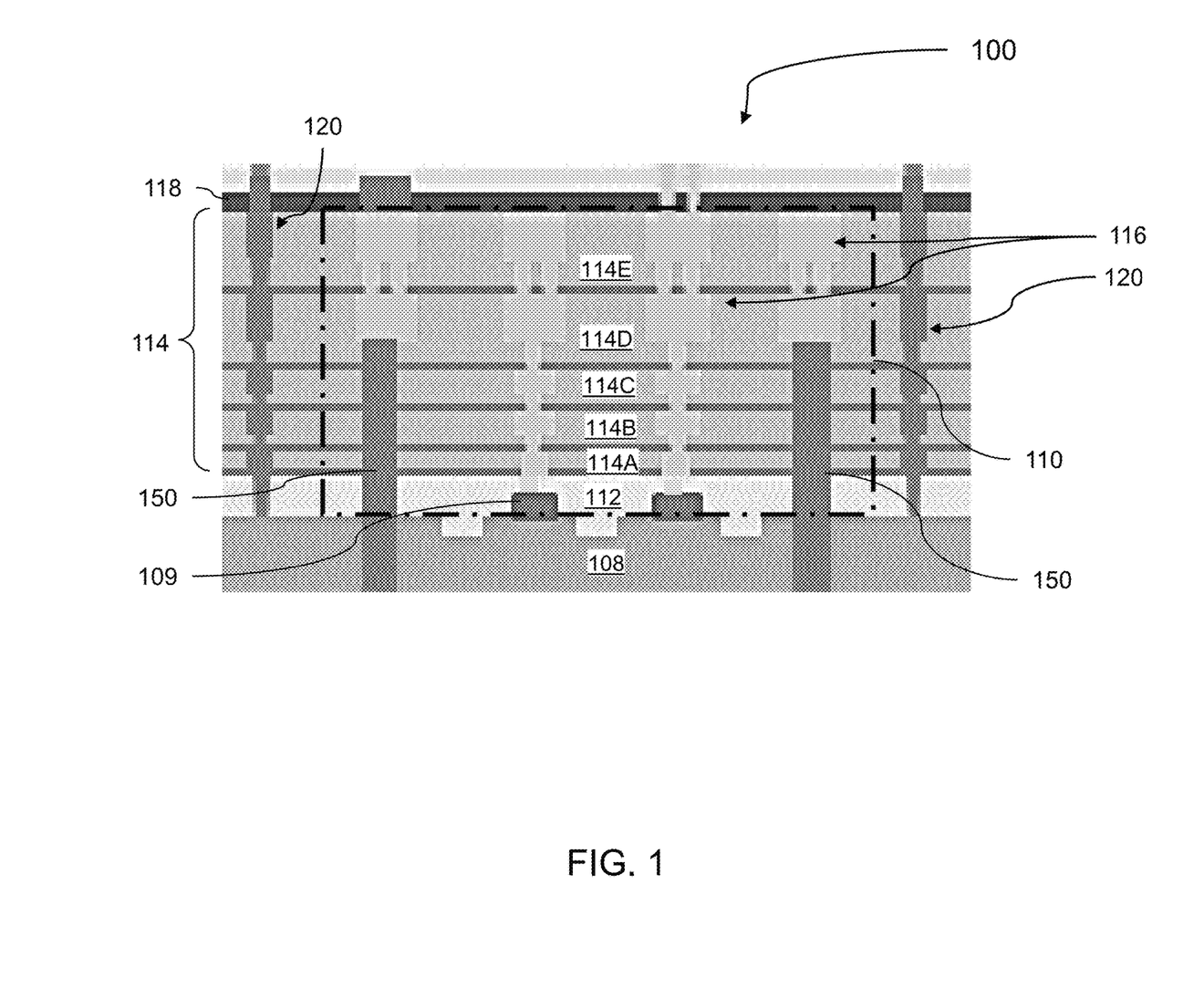
FIG. 1 is a vertical cross-sectional view of a semiconductor die 100, according to various embodiments of the present disclosure.

FIG. 1 is a vertical cross-sectional view of a semiconductor die 100, according to various embodiments of the present disclosure. Referring to FIG. 1, the semiconductor die 100 includes a first semiconductor substrate 108 and a first interconnect structure 110. In some embodiments, the first semiconductor substrate 108 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 108 may be a semiconductor-on-insulator (SOI) substrate. In various embodiments, the first semiconductor substrate 108 may take the form of a planar substrate, a substrate with multiple fins, nanowires, or other forms known to people having ordinary skill in the art. Depending on the requirements of design, the first semiconductor substrate 108 may be a P-type substrate or an N-type substrate and may have doped regions therein. The doped regions may be configured for an N-type device or a P-type device.

In some embodiments, the first semiconductor substrate 108 includes isolation structures defining at least one active area, and a first device layer may be disposed on/in the active area. The first device layer may include a variety of devices. In some embodiments, the variety of devices may include active components, passive components, or a combination thereof. In some embodiments, the first semiconductor substrate 108 may include circuit components that form a memory array or other memory structure. In other embodiments, the first semiconductor substrate 108 may include circuit components that provide non-memory functionality, such as communication, logic functions, processing, or the like. In some embodiments, the devices may include integrated circuits devices. The devices may be, for example, transistors, capacitors, resistors, diodes, photodiodes, fuse devices, or other similar devices. In some embodiments, the first device layer includes gate electrodes 109, source/drain regions, spacers, and the like.

The first interconnect structure 110 may include an inter-layer dielectric (ILD) 112, one or more inter-metal dielectric (IMD) layers 114 (e.g., 114A, 114B, 114C, 114D, 114E), metal features 116, a passivation layer 118, and a seal ring 120. In some embodiments, the ILD 112 may be formed of a dielectric material such as silicon oxide ($SiO_2$) silicon nitride (SiN or $Si_3N_4$), silicon carbide (SiC), or the like, and may be deposited by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

In some embodiments, the first interconnect structure 110 may include five IMD layers 114A-114E as shown in FIG. 1. However, the present disclosure is not limited to any particular number of IMD layers 114. The IMD layers 114 may include an extra low-k (ELK) dielectric material having a dielectric constant (k) less than about 2.6, such as from 2.5 to 2.2. In some embodiments, ELK dielectric materials include carbon-doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials may include porous versions of existing dielectric material, such as porous hydrogen silsesquioxane (HSQ), porous methyl silsesquioxane (MSQ), porous polyarylether (PAE), porous SiLK, or porous $SiO_2$. The IMD layers 114 may be formed by any suitable deposition process. In some embodiments, the IMD layers 114 may be deposited by a PECVD process or by a spin coating process.

The metal features 116 may include line and via structures. The metal features 116 be formed of any suitable electrically conductive material, such as tungsten (W), copper (Cu), a copper alloy, aluminum (Al), an aluminum alloy, combinations thereof, or the like. Other suitable electrically conductive materials are within the contemplated scope of disclosure.

The metal features 116 may be electrically connected to the gate electrodes 109, such that the first interconnect structure 110 may electrically connect semiconductor devices formed on the first semiconductor substrate 108.

The seal ring 120 may extend around the periphery of the first die 100. For example, the seal ring 120 may extend through the dielectric layers such as ILD 112, IMD layers 114, at the periphery of the first interconnect structure 110. The seal ring 120 may include line structures and via structures. The seal ring 120 may be configured to protect the first interconnect structure 110 from contaminant diffusion and/or physical damage during device processing, such as plasma etching and/or deposition processes. The physical damage may include electrostatic discharge due to charge buildup during the plasma etch and/or deposition processes.

The seal ring 120 may include copper at an atomic percentage greater than 80%, such as greater than 90% and/or greater than 95% although greater or lesser percentages may be used. The seal ring 120 may include line structures and via structures that are electrically connected to each other. The seal ring 120 may be electrically isolated from the metal features 116.

In some embodiments, the die 100 may optionally include one or more through silicon via (TSV) structures 150. The TSV structures 150 may extend into and/or through the first semiconductor substrate 108, the ILD 112, and one or more of the IMD layers 114, to electrically connect the metal features 116 to elements formed on the first semiconductor substrate 108 and/or elements of adjacent dies. The TSV structures 150 may be formed of an electrically conductive metal. For example, the TSV structures 150 may include copper at an atomic percentage greater than 80%, such as greater than 90% and/or greater than 95%, although greater or lesser percentages of copper may be used. Other suitable electrically conductive metal materials are within the contemplated scope of disclosure.

In some embodiments, the metal features 116 and/or the seal ring 120 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 116 and/or the seal ring 120 may be formed by an electroplating process.

For example, the Damascene processes may include patterning the dielectric layers (e.g., ILD 112 and/or IMD layers 114) to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden).

In particular, the patterning, metal deposition, and planarizing processes may be performed for each of the dielectric layers (e.g., ILD 112 and/or IMD layers 114), in order to form the metal features 116 and/or portions of the seal ring 120 therein. For example, the ILD 112 may be deposited and patterned to form via structures and/or trenches. A deposition process may then be performed to fill the openings in the ILD layer 112 with a conductive material. A planarization process may then be performed to remove the overburden. The above deposition, patterning, and planarization processes may be repeated to form IMD layers 114A-114E and the corresponding portions of the metal features 116 and/or seal ring 120 disposed therein.

In some embodiments, barrier layers (not shown) may be disposed between the ILD 112 and/or IMD layers 114, and the metal features 116, the seal ring 120, and/or the TSV structures 150, to prevent metal diffusion into the first semiconductor substrate 108 and/or ILD 112 and/or IMD layers 114. The barrier layer may include Ta, TaN, Ti, TiN, CoW, or combinations thereof, for example. Other suitable barrier layer materials are within the contemplated scope of disclosure.

Figure 2:
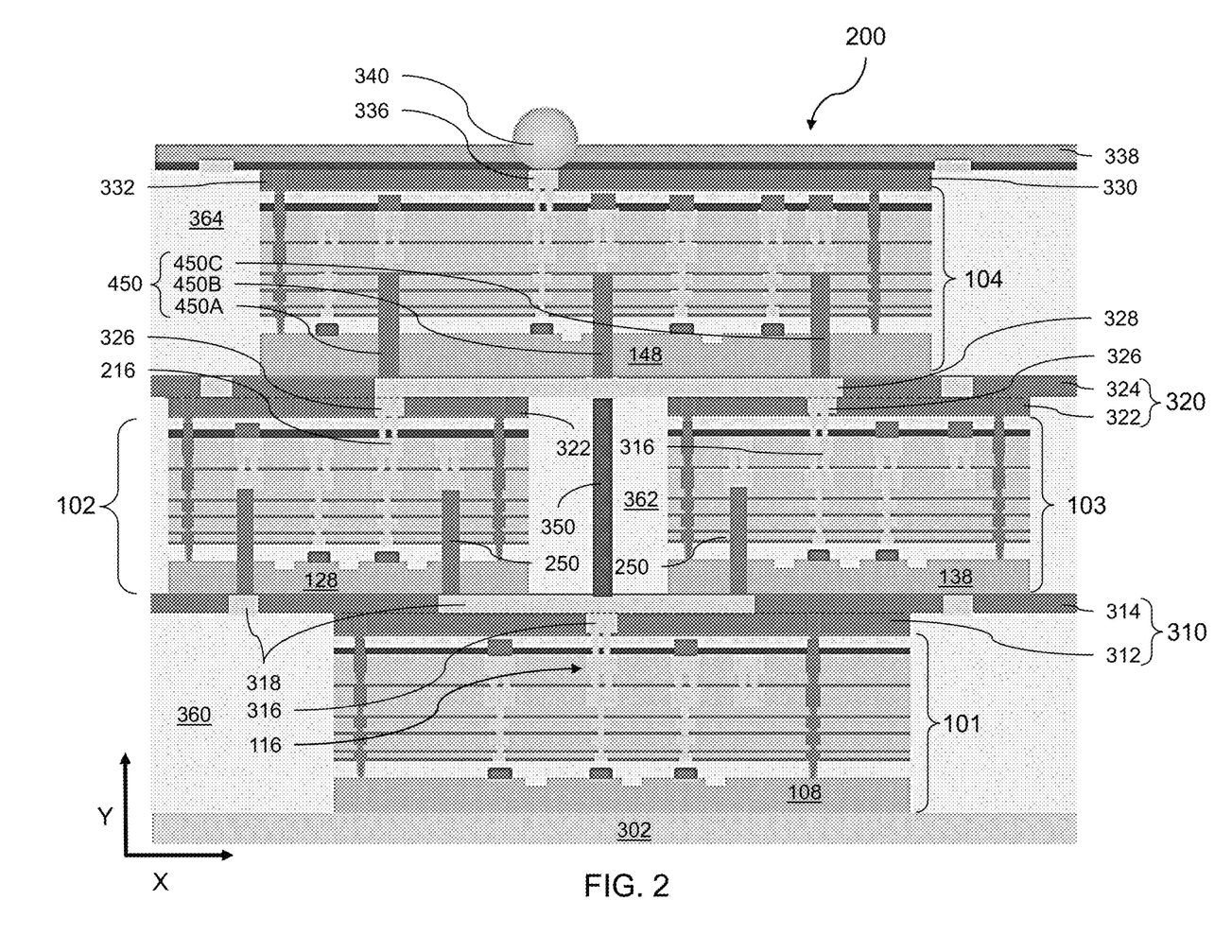
FIG. 2 is a vertical cross-sectional view of a die stack 200, according to various embodiments of the present disclosure.

FIG. 2 is a vertical cross-sectional view of a die stack 200, according to various embodiments of the present disclosure. Referring to FIG. 2, the die stack 200 includes a first semiconductor die 101, a second semiconductor die 102, a third semiconductor die 103, and a fourth semiconductor die 104, disposed in a stacked arrangement. In particular, the second semiconductor die 102 and third semiconductor die 103 may be stacked on respective portions of the first semiconductor die 101. The fourth semiconductor die 104 may be stacked on respective portions of the second semiconductor die 102 and third semiconductor die 103. For example, the first semiconductor die 101, second semiconductor die 102, third semiconductor die 103, and fourth semiconductor die 104 may be stacked in a vertical direction Y, with the second semiconductor die 102 and third semiconductor die 103, collectively being disposed adjacent to one another in a horizontal direction X. In other words, the second semiconductor die 102 and third semiconductor die 103 may be disposed in the same horizontal plane, while the first semiconductor die 101 may be disposed in a different horizontal plane and the fourth semiconductor die 104 may be disposed in yet another different horizontal plane.

In some embodiments, the first semiconductor die 101 may be disposed on a wafer 302 or carrier substrate, which may be removed when the die stack 200 is assembled with other device components.

The first semiconductor die 101, second semiconductor die 102, third semiconductor die 103, and fourth semiconductor die 104 may be similar to the first semiconductor die 100 of FIG. 1. As such, previously described elements will not be described again in detail. The first semiconductor die 101, second semiconductor die 102, third semiconductor die 103, and fourth semiconductor die 104 may be independently selected from, for example, a SoIC die, a 3DIC die, a processor die, a power management die, a logic die, a communication management die (such as a baseband die), or combinations thereof. In some embodiments, the first semiconductor die 101, second semiconductor die 102, third semiconductor die 103, and fourth semiconductor die 104 may each be random access memory (RAM) dies, such as SRAM or DRAM chips. The first semiconductor die 101, second semiconductor die 102, third semiconductor die 103, and fourth semiconductor die 104 may be collectively or individually connected to a logic die, or other external device such as a printed circuit board, etc., via one or more metal bumps 340. In some embodiments one of the first semiconductor die 101, second semiconductor die 102, third semiconductor die 103, and fourth semiconductor die 104 may be a logic chip (e.g., logic die), and the remainder of the first semiconductor die 101, second semiconductor die 102, third semiconductor die 103, and fourth semiconductor die 104 may be memory dies or chips. The first semiconductor die 101 has a first semiconductor substrate 108. The second semiconductor die 102 has a second semiconductor substrate 128. The third semiconductor die 103 has a third semiconductor substrate 138. The fourth semiconductor die 104 has a fourth semiconductor substrate 148.

A first dielectric encapsulation (DE) layer 360 may surround the first semiconductor die 101, a second DE layer 362 may surround the second semiconductor die 102 and third semiconductor die 103. A third DE layer 364 may surround the fourth semiconductor die 104. In some embodiments, the first DE layer 360, second DE layer 362, and third DE layer 364 may be formed of a molding compound, silicon oxide, silicon nitride, or a combination thereof. The molding compound may include a resin and a filler. The first DE layer 360, second DE layer 362, and third DE layer 364 may be formed by spin-coating, lamination, deposition, or the like. Each of the first DE layer 360, second DE layer 362, and third DE layer 364 may be formed of the same material. In other embodiments, each of the first DE layer 360, second DE layer 362, and third DE layer 364 may be formed of different materials. In yet other embodiments, some of first DE layer 360, second DE layer 362, and third DE layer 364 may be formed of the same materials, while other DE layers may be formed of a different material. In a similar fashion, the DE layers may be formed by the same process, different processes or a combination thereof.

The die stack 200 may include a first bonding structure 310 configured to bond the first semiconductor die 101 to the second semiconductor die 102 and third semiconductor die 103. A second bonding structure 320 may be configured to bond the second semiconductor die 102 and third semiconductor die 103, to the fourth semiconductor die 104. A third bonding structure 330 may be disposed on a front side of the fourth semiconductor die 104, and a passivation layer 338 may be formed on the third bonding structure 330.

In particular, the first bonding structure 310 may include a first front side bonding layer 312 disposed on a front side of the first semiconductor die 101. A first backside bonding layer 314 disposed on the first front side bonding layer 312, as well as the back sides of the respective second semiconductor die 102 and third semiconductor die 103, and the first DE layer 360. The second bonding structure 320 may include a second front side bonding layer 322 disposed on front sides of the respective second semiconductor die 102 and third semiconductor die 103. The second bonding structure 320 may also include a second backside bonding layer 324 disposed on the second front side bonding layer 322, a back side of the fourth semiconductor die 104, and the second DE layer 362.

The first front side bonding layer 312 may include one or more first layer bonding pads 126. The first backside bonding layer 314 may include a first RDL structure 318. The second front side bonding layer 322 may include second layer bonding pads 326. The second front side bonding layer 322 may also include the second backside bonding layer 324. The second backside bonding layer 324 may include a second RDL structure 328. The third bonding structure 330 may include a third front side bonding layer 332. The third bonding structure may also include one or more third layer bonding pads 336 formed within the third front side bonding layer 332.

The first layer bonding pads 126, second layer bonding pads 326, third layer bonding pads 336 and/or first RDL structure 318, and second RDL structure 328 may include an electrically conductive metal, such as tungsten (W), copper (Cu), a copper alloy, aluminum (Al), an aluminum alloy, or a combination thereof. Other suitable electrically conductive metals are within the contemplated scope of disclosure. In some embodiments, the electrically conductive metal may include copper at an atomic percentage greater than 80%, such as greater than 90% and/or greater than 95%, although greater or lesser percentages of copper may be used. Other suitable pad materials may be within the contemplated scope of disclosure. In some embodiments, the third layer bonding pads 336 may be under bump metallization (UBM) pads for mounting conductive connectors, such as metal pillars, micro-bumps, metal bumps or the like.

The first layer bonding pads 126, second layer bonding pads 326, third layer bonding pads 336 and/or first RDL structure 318, and second RDL structure 328 may be formed by a dual-Damascene processes, or by one or more single-Damascene processes, for example. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the first layer bonding pads 126, second layer bonding pads 326, third layer bonding pads 336 and/or first RDL structure 318, and second RDL structure 328 may be formed by an electroplating process.

The die stack 200 may include a through dielectric via (TDV) structure 350 that extends through the second DE layer 362 and electrically connects the first RDL structure 318, and/or second RDL structure 328. The TDV structure 350 may be formed of a metal, such as tungsten (W), copper (Cu), a copper alloy, aluminum (Al), an aluminum alloy, or a combination thereof. For example, the TDV structure 350 may include copper at an atomic percentage greater than 80%, such as greater than 90% and/or greater than 95%, although greater or lesser percentages of copper may be used.

The first RLD structure 318 may be configured to electrically connect one or more conductive elements of the first semiconductor die 101 to conductive elements of the second semiconductor die 102 and third semiconductor die 103. For example, the first RLD structure 318 may electrically connect metal features 116 of the first semiconductor die 101 to TSV structures 250 of the second semiconductor die 102 and third semiconductor die 103. The TDV structure 350 may electrically connect the metal features 116 of the first semiconductor die 101 to a TSV 450 of the fourth semiconductor die 104.

The second RLD structure 328 may be configured to electrically connect conductive elements of the second semiconductor die 102 and third semiconductor die 103 to one or more conductive elements of the fourth semiconductor die 104. For example, the second RLD structure 328 may electrically connect metal features 216 of the second semiconductor die 102 and metal features 316 of the third semiconductor die 103 to respective TSV structures 450 of the fourth semiconductor die 104.

Accordingly, the second semiconductor die 102, third semiconductor die 103, and fourth semiconductor die 104 may include one or more respective TSV structures 250, 450 for establishing electrical interconnections. For example, in some embodiments, the fourth semiconductor dies 104 may include a first TSV structure 450A, a second TSV structure 450B, and a third TSV structure 450C that each extend through the fourth semiconductor substrate 148. The first TSV structure 450A may be electrically connected to the second semiconductor die 102, the second TSV structure 450B may be electrically connected to the first semiconductor die 101 via the TDV structure 350, and the third TSV structure 450C may be electrically connected to the third semiconductor die 103. In some embodiments, the first semiconductor die 101 may omit a TSV structure, since it is not required for establishing electrical interconnections with the other dies such as the second semiconductor die 102, third semiconductor die 103, and fourth semiconductor die 104.

Figure 3:
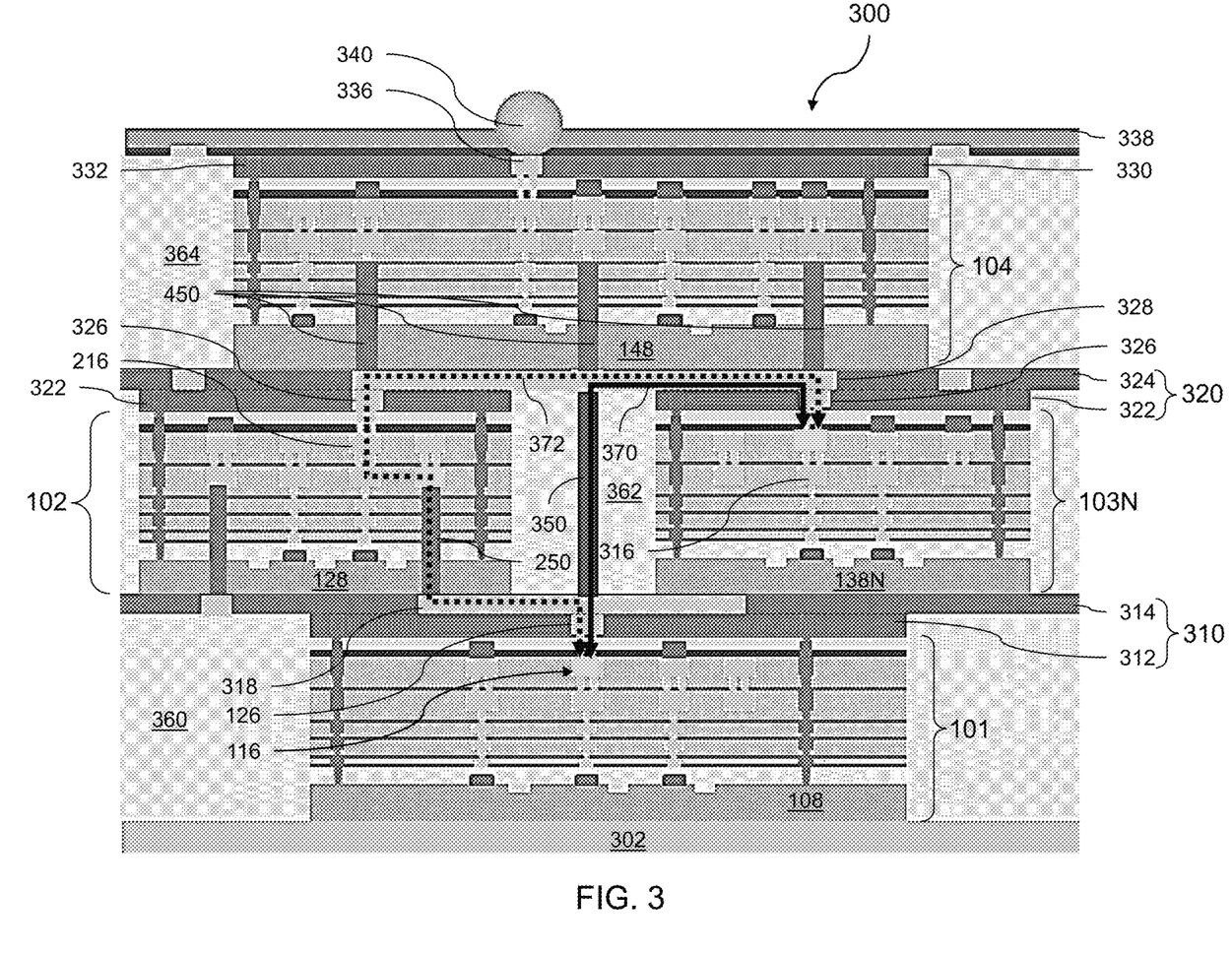
FIG. 3 is a vertical cross-sectional view of a die stack 300, according to various embodiments of the present disclosure.

FIG. 3 is a vertical cross-sectional view of a die stack 300, according to various embodiments of the present disclosure. The die stack 300 may be similar to the die stack 200 of FIG. 2. Accordingly, only the differences there between will be discussed in detail. Referring to FIG. 3, the die stack 300 includes the first semiconductor die 101, second semiconductor die 102, and fourth semiconductor die 104 as shown in FIG. 3. However, the die stack 300 includes a different third semiconductor die 103N in place of the third semiconductor die 103.

In some embodiments, the first semiconductor die 101 and the third semiconductor die 103N may not include a TSV structure (e.g., is a non-TSV die), while the second semiconductor die 102, and fourth semiconductor die 104 may include respective TSV structures 250 and 450. In particular, the third semiconductor die 103N may not include a TSV structure to interconnect the third semiconductor die 103N with the first semiconductor die 101. Accordingly, the die stack 300 may include two non-TSV dies, namely the first semiconductor die 101 and third semiconductor die 103N.

In various embodiments, the first semiconductor die 101, second semiconductor die 102, third semiconductor die 103N and/or fourth semiconductor die 104 may each be memory dies such as SRAM or MRAM dies (e.g., may include substrates that comprise a memory array or structure).

In some embodiments, the third semiconductor die 103N may have a different functionality than the first semiconductor die 101, second semiconductor die 102, and/or fourth semiconductor die 104. For example, in embodiments in which the first semiconductor die 101, second semiconductor die 102, and fourth semiconductor die 104 are memory dies, the third semiconductor die 103N may have a non-memory functionality. For example, the third semiconductor die 103N may be an application-specific integrated circuit (ASIC) chip, an analog chip, a sensor chip, a wireless and radio frequency chip, a voltage regulator chip, or the like.

The third semiconductor die 103N may be interconnected to the first semiconductor die 101 by utilizing the first RDL structure 318 and second RDL structure 328, and at least one of the TDV structure 350 and the respective TSV structure 250 of the second semiconductor die 102. For example, the first semiconductor die 101 and third semiconductor die 103N may be electrically connected through a first connection circuit 370 including a conductive line of the first RDL structure 318, the TDV structure 350, and the second RDL structure 328. The first semiconductor die 101 and third semiconductor die 103N may alternatively or additionally be electrically connected through a second connection circuit 372 that may include the first RDL structure 318, the TSV structure 250, and metal features 116 of the second semiconductor die 102, and the second RDL structure 328. The die stack 300 may be electrically connected to one or more additional components or dies, such as a logic die or a printed circuit board, via metal bump 340.

Figure 4:
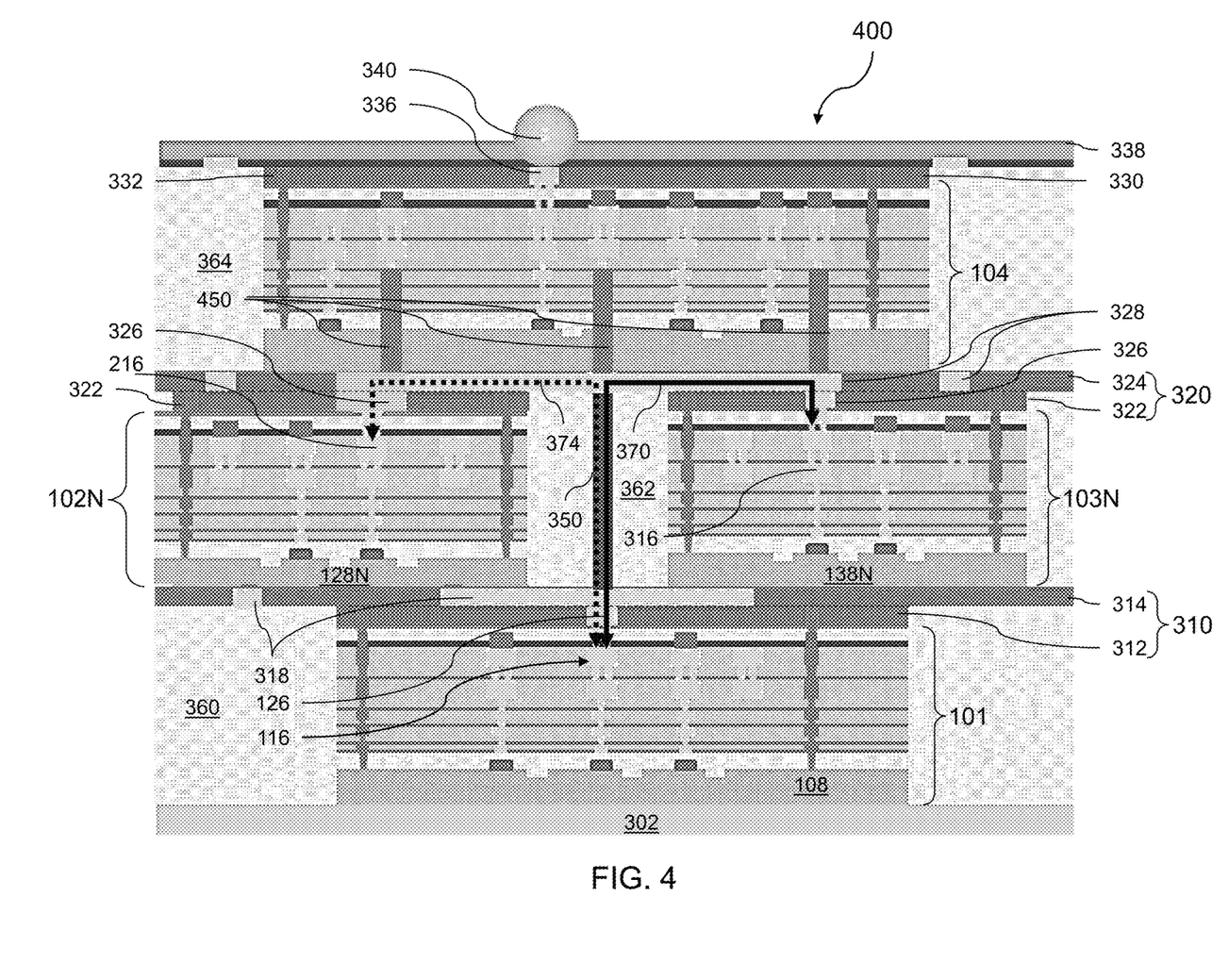
FIG. 4 is a vertical cross-sectional view of die stack 400, according to various embodiments of the present disclosure.

FIG. 4 is a vertical cross-sectional view of a die stack 400, according to various embodiments of the present disclosure. The die stack 400 may be similar to the die stack 300 of FIG. 3. Accordingly, only the differences there between will be discussed in detail.

Referring to FIG. 4, the die stack 400 includes the first semiconductor die 101, third semiconductor die 103N, and fourth semiconductor die 104 as shown in FIG. 4. However, the die stack 400 includes a different second semiconductor die 102N in place of the second semiconductor die 102.

The second semiconductor die 102N may include a second semiconductor substrate 128N that is not perforated and may have a different functionality than the first semiconductor die 101, third semiconductor die 103N, and/or fourth semiconductor die 104. For example, the second semiconductor die 102N may be an application-specific integrated circuit (ASIC) chip, an analog chip, a sensor chip, a wireless and radio frequency chip, a voltage regulator chip, or the like. In the alternative the first semiconductor die 101, second semiconductor die 102N, third semiconductor die 103N and fourth semiconductor die 104 may have the same functionality (e.g., may be memory dies).

In particular, the second semiconductor die 102N may not include a TSV structure to interconnect the second semiconductor die 102N to the first semiconductor die 101. Accordingly, the die stack 400 may include three non-TSV dies, namely the first semiconductor die 101, second semiconductor die 102N and third semiconductor die 103N.

The second semiconductor die 102N may be interconnected to the first semiconductor die 101 by utilizing the first RDL structure 318 and second RDL structure 328, and the TDV structure 350. For example, the first semiconductor die 101 and second semiconductor die 102N may be electrically interconnected through a third connection circuit 374 including a conductive line of the first RDL structure 318, the TDV structure 350, and the second RDL structure 328. The first semiconductor die 101 and third semiconductor die 103N may be electrically connected through the first connection circuit 370.

In other embodiments, the die stack 400 may include multiple TDV structures 350 (not shown). In this embodiment, each of first connection circuit 370 and third connection circuit 374 may include a different one of the TDV structures 350.

Figure 5A:
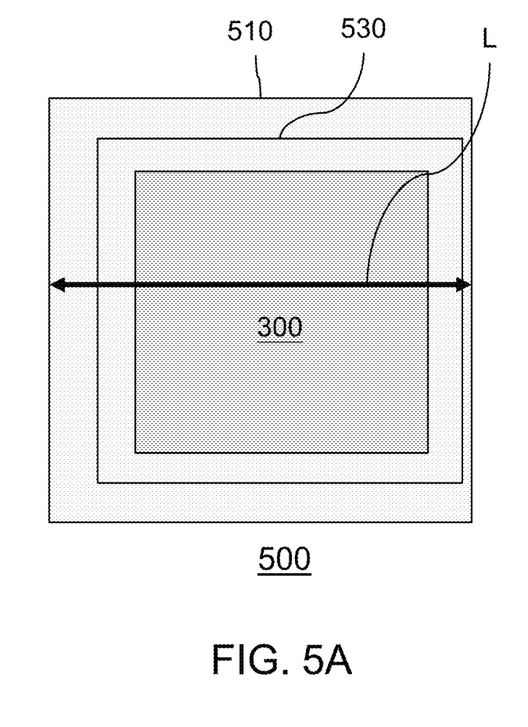
FIG. 5A is a simplified top view of a SoIC structure 500, according to various embodiments of the present disclosure.
Figure 5B:
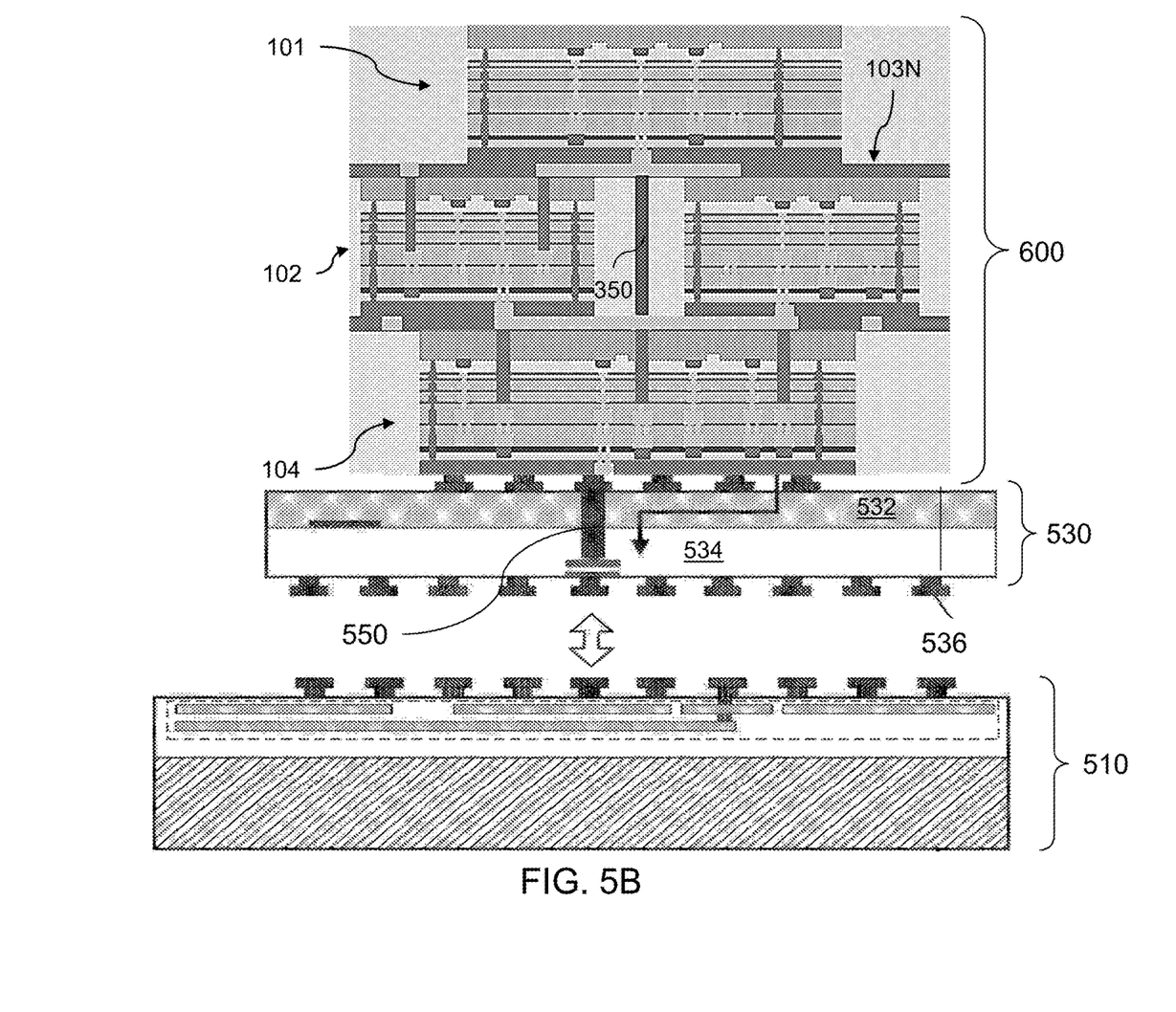
FIG. 5B is a vertical cross-sectional view of the SoIC structure 500 of FIG. 5A, taken along line L of FIG. 5A, according to various embodiments of the present disclosure.

FIG. 5A is a simplified top view of an SoIC structure 500, according to various embodiments of the present disclosure. FIG. 5B is a vertical cross-sectional view of the SoIC structure 500, taken along line L of FIG. 5A, according to various embodiments of the present disclosure.

Referring to FIGS. 5A and 5B, the SoIC structure 500 may be formed by direct die stacking and die-to-die bonding, such as by a hybrid bonding process. The SoIC structure may include at least one die stack 600, a logic die 530, and a device die 510. As shown in FIG. 5B, the die stack 600 may be similar to the die stack 300 of FIG. 3 and may include first semiconductor die 101, second semiconductor die 102, third semiconductor die 103N, and fourth semiconductor die 104 as well as associated interconnect elements. However, in other embodiments, the die stack 600 may include any of the die stack 200, die stack 300, and/or die stack 400 described herein.

In particular, the die stack 300 as shown in FIG. 3 may be inverted and bonded to the logic die 530. The wafer 302 may be removed after the bonding process to form the die stack 600. The logic die 530 may be bonded to the device die 510. The logic die 530 may include a semiconductor substrate 532, and interconnect structure 534, and a TSV structure 550. The logic die 530 may include circuitry to serve as a controller providing processing, I/O functions, and the like. Electrical connectors 536 on a surface of the logic die 530 connect the die stack 600 and/or logic die 530 to other package components, for example, to the interconnection device die 510.

The SoIC structure 500 may include SRAM, DRAM, or other stackable memory structure. For example, one or more of the first semiconductor die 101, second semiconductor die 102, third semiconductor die 103N, and fourth semiconductor die 104 of the die stack 600 may be memory dies that include semiconductor substrates comprising circuit components that form a memory array or other memory structure. However, in some embodiments, one or more of the first semiconductor die 101, second semiconductor die 102, third semiconductor die 103N, and fourth semiconductor die 104 may have a non-memory functionality.

For example, by providing a stacked structure wherein at least two dies (e.g., second semiconductor die 102 and third semiconductor die 103N) are disposed on the same horizontal plane within the die stack 600, novel interconnection pathways may be provided, such as the shared utilization of TSV structures and/or TDV structures to interconnect with other dies. For example, the third semiconductor die 103N, which does not include a TSV, may be interconnected by a TSV structure of the second semiconductor die 102 or the TDV structure 350.

In comparison, a conventional SoIC structure including a die stack, such as a memory die stack, each semiconductor die in the stack includes a TSV structure to interconnect the semiconductor dies. Accordingly, conventional die stacks are limited to including TSV dies, in order to provide die interconnection. By removing or omitting the TSV in a particular semiconductor die (e.g., third semiconductor die 103N), increased functionality may be provided by die stacks according to various embodiments of the present disclosure. The real estate that would previously be devoted to the formation of a TSV structure may now be used for other purposes. In addition, manufacturing costs may be reduced, since less expensive non-TSV dies (e.g., first semiconductor die 101, second semiconductor die 102N, and third semiconductor die 103N) may be utilized.

Various embodiments provide a die stack 200, 300, 400 comprising: a first semiconductor die 101 comprising a first semiconductor substrate 108; a first redistribution layer (RDL) structure 318 disposed on a front surface of the first semiconductor die 101 and electrically connected to the first semiconductor substrate 108; a second semiconductor die 102, 102N bonded to the front surface of the first semiconductor die 101 and comprising a second semiconductor substrate 128, 128N; a third semiconductor die 103, 103N bonded to the front surface of the first semiconductor die 101 and comprising a third semiconductor substrate 138, 138N; a second RDL structure 328 disposed on front surfaces of the second semiconductor die 102 and third semiconductor die 103, 103N and electrically connected to the second semiconductor substrate 128, 128N of the second semiconductor die 102, 102N and the third semiconductor substrate 138, 138N of the third semiconductor die 103, 103N; and a through dielectric via (TDV) structure 350 extending between the second semiconductor die 102 and third semiconductor die 103, 103N, wherein the TDV structure 350 is electrically connected to the first RDL structure 318 and second RDL structure 328, and wherein the second semiconductor die 102, 102N and third semiconductor die 103, 103N are disposed in a plane that extends perpendicular to a vertical stacking direction Y of the die stack 200, 300, 400.

Various embodiments provide a system on integrated circuit (SoIC) structure 500 comprising: a die stack 600 comprising: a first semiconductor die 101 comprising a first semiconductor substrate 108; a first redistribution layer (RDL) structure 318 disposed on a front surface of the first semiconductor die 101 and electrically connected to the first semiconductor substrate 108; a second semiconductor die 102 bonded to the front surface of the first semiconductor die 101 and comprising a second semiconductor substrate 128; a third semiconductor die 103N bonded to the front surface of the first semiconductor die 101 and comprising a third semiconductor substrate 138N; a second RDL structure 328 disposed on front surfaces of the second semiconductor die 102 and third semiconductor die 103N and electrically connected to the second semiconductor substrate 128 and third semiconductor substrate 138N; a fourth semiconductor die 104 bonded to the front surfaces of the second semiconductor die 102 and third semiconductor die 103N, wherein the fourth semiconductor die 104 comprises a fourth semiconductor substrate 148; and a through dielectric via (TDV) structure 350 extending between the second semiconductor die 102 and third semiconductor die 103N and electrically connecting the first RDL structure 318 and the second RDL structure 328; and a logic die 530 bonded to the die stack 600 and comprising a logic die semiconductor substrate 532 comprising logic circuitry. The second semiconductor die 102 and third semiconductor die 103N are disposed in a plane that extends perpendicular to a vertical stacking direction Y of the die stack 600.

In an embodiment die stack, the second semiconductor die 102 may include a through silicon via (TSV) structure 250 that extends through the second semiconductor substrate 128, wherein the second semiconductor die 102 is electrically connected to the first RDL structure 318; and the third semiconductor die 103N is electrically connected to the first semiconductor die 101 by a second connection circuit 372 that includes a conductive line of the second RDL structure 328, the TSV structure 250 of the second semiconductor die 102, and a conductive line of the first RDL structure 318.

In one embodiment die stack, the second connection circuit 372 may include metal features 216 of the second semiconductor die 102. In one embodiment die stack, the third semiconductor die 103N may be a non-TSV die. In one embodiment die stack the first semiconductor die 101 may be a non-TSV die. In another embodiment die stack, the die stack may include a fourth semiconductor die 104 bonded to the front surfaces of the second semiconductor die 102 and the third semiconductor die 103N and may include a fourth semiconductor substrate 148. In one embodiment die stack, the fourth semiconductor die 104 may include: a first TSV structure 450A that may extend through the fourth semiconductor substrate 148 and may be electrically connected to the first semiconductor die 101 by the TDV structure 350; a second TSV structure 450B that may extend through the fourth semiconductor substrate 148 and may be electrically connected to the second semiconductor die 102; and a third TSV structure 450C that may extend through the fourth semiconductor substrate 148 and may be electrically connected to the third semiconductor die 103N. In one embodiment die stack, the fourth semiconductor die 104 may be electrically connected to an external device by a metal bump. In one embodiment die stack, the first semiconductor die 101, the second semiconductor die 102, and the fourth semiconductor die 104 may be random access memory dies; and the third semiconductor die 103N has a different function than the first semiconductor die 101, the second semiconductor die 102, and the fourth semiconductor die 104. In one embodiment die stack, the second semiconductor die 102 may include a through silicon via (TSV) structure that extends through the second semiconductor substrate 128 and electrically contacts to the first RDL structure 318; and the third semiconductor die 103N may be electrically connected to the first semiconductor die 101 by a first connection circuit 370 that may include a conductive line of the second RDL structure 328 and the TDV structure 350. In one embodiment die stack, the third semiconductor die 103N may be a non-TSV die. In one embodiment die stack, the first semiconductor die 101 may be electrically connected to a fourth semiconductor die 104 by the TDV structure 350. In one embodiment die stack, the second semiconductor die 102 may be electrically connected to the first semiconductor die 101 by a first connection circuit 370 that includes a conductive line of the second RDL structure 328 and the TDV structure 350; and the third semiconductor die 103N may be electrically connected to the first semiconductor die 101 by a third connection circuit 374 that includes a conductive line of the second RDL structure 328 and the TDV structure 350.

Various embodiments provide a system on integrated circuit (SoIC) structure 500 comprising: a die stack 600 may include: a first semiconductor die 101 comprising a first semiconductor substrate 108 may include a memory array; a first redistribution layer (RDL) structure 318 disposed on a front surface of the first semiconductor die 101 and electrically connected to the first semiconductor substrate 108; a second semiconductor die 102 bonded to the front surface of the first semiconductor die 101 and comprising a second semiconductor substrate 128 comprising a memory array; a third semiconductor die 103N bonded to the front surface of the first semiconductor die 101 and comprising a third semiconductor substrate 138N comprising a memory array; a second RDL structure 328 disposed on front surfaces of the second semiconductor die 102 and third semiconductor die 103N and electrically connected to the second semiconductor substrate 128 and third semiconductor substrate 138N; a fourth semiconductor die 104 bonded to the front surfaces of the second semiconductor die 102 and third semiconductor die 103N and may include a third semiconductor substrate 138N that includes a memory array; and a through dielectric via (TDV) structure 350 extending between the second semiconductor die 102 and third semiconductor die 103N and electrically connecting the first semiconductor die 101 and the fourth semiconductor die 104; and a logic die 530 bonded to the die stack 600 and includes a logic die semiconductor substrate 532 comprising logic circuitry.

In an embodiment SOIC structure, the second semiconductor die 102 may include a through silicon via (TSV) structure 250 that extends through the second semiconductor substrate 128 and may electrically contact the first RDL structure 318; and the third semiconductor die 103N may be electrically connected to the first semiconductor die 101 by a second connection circuit 372 that includes a conductive line of the second RDL structure 328, the TSV structure 250 of the second semiconductor die 102, and a conductive line of the first RDL structure 318. In one embodiment SOIC structure, the first semiconductor die 101 and the third semiconductor die 103N may be non-TSV dies. In one embodiment SOIC structure, the second semiconductor die 102 may include a through silicon via (TSV) structure 250 that extends through the second semiconductor substrate 128 and may electrically contact the first RDL structure 318; and the third semiconductor die 103N may be electrically connected to the first semiconductor die 101 by a first connection circuit 370 that includes a conductive line of the second RDL structure 328 and the TDV structure 350, wherein the first semiconductor die 101 may be electrically connected to the logic die by the TDV structure 350 and a TSV structure 450 of the fourth semiconductor die 104. In one embodiment SOIC structure, the first semiconductor die 101, the second semiconductor die 102, and the fourth semiconductor die 104 may each include a memory die. The second semiconductor die 102 and third semiconductor die 103N may be disposed in a plane that extends perpendicular to a vertical stacking direction Y of the die stack 600.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stack comprising:
   a first semiconductor die comprising a first semiconductor substrate;
   a first redistribution layer (RDL) structure disposed on a front surface of the first semiconductor die and electrically connected to the first semiconductor substrate;
   a second semiconductor die bonded to the front surface of the first semiconductor die and comprising a second semiconductor substrate;
   a third semiconductor die bonded to the front surface of the first semiconductor die and comprising a third semiconductor substrate;
   a second RDL structure disposed on front surfaces of the second semiconductor die and third semiconductor die and electrically connected to the second semiconductor substrate and third semiconductor substrate;
   a through dielectric via (TDV) structure extending between the second semiconductor die and the third semiconductor die, wherein the TDV structure is directly electrically connected to the first RDL structure and second RDL structure; and
   a second bonding structure comprising:
      a discontinuous second frontside bonding layer having a first portion that is bonded directly to the front surface of the second semiconductor die and a separate second portion that is bonded directly to the front surface of the third semiconductor die; and
      a continuous second backside bonding layer bonded to the second and third semiconductor dies by the second frontside bonding layer,
   wherein the second RDL structure comprises:
      a conductive line that extends within the second backside bonding layer; and
      second layer bonding pads that extend through the second frontside bonding layer to bond and directly electrically connect a bonding pad of the second semiconductor die and a bonding pad of the third semiconductor die to the conductive line,
   wherein the second semiconductor die and third semiconductor die are disposed in a plane that extends perpendicular to a vertical stacking direction of the die stack.

2. The die stack of claim 1, wherein:
   the second semiconductor die comprises a through silicon via (TSV) structure that extends through the second semiconductor substrate, wherein the second semiconductor die is electrically connected to the first RDL structure; and
   the third semiconductor die is electrically connected to the first semiconductor die by a second connection circuit that includes the conductive line of the second RDL structure, the TSV structure of the second semiconductor die, and a conductive line of the first RDL structure.

3. The die stack of claim 2, wherein the second connection circuit comprises metal features of the second semiconductor die.

4. The die stack of claim 2, wherein the third semiconductor die is a non-TSV die.

5. The die stack of claim 4, wherein the first semiconductor die is a non-TSV die.

6. The die stack of claim 2, further comprising a fourth semiconductor die bonded to the front surfaces of the second semiconductor die and the third semiconductor die and comprising a fourth semiconductor substrate.

7. The die stack of claim 6, wherein the fourth semiconductor die comprises:
   a first TSV structure that extends through the fourth semiconductor substrate and is electrically connected to the first semiconductor die by the TDV structure;
   a second TSV structure that extends through the fourth semiconductor substrate and is electrically connected to the second semiconductor die; and
   a third TSV structure that extends through the fourth semiconductor substrate and is electrically connected to the third semiconductor die.

8. The die stack of claim 7, wherein the fourth semiconductor die is electrically connected to an external device by a metal bump.

9. The die stack of claim 6, wherein:
   the first semiconductor die, the second semiconductor die, and the fourth semiconductor die are random access memory dies; and the third semiconductor die has a different function than the first semiconductor die, the second semiconductor die, and the fourth semiconductor die.

10. The die stack of claim 1, wherein:
the second semiconductor die comprises a through silicon via (TSV) structure that extends through the second semiconductor substrate and electrically contacts to the first RDL structure; and
the third semiconductor die is electrically connected to the first semiconductor die by a first connection circuit that includes a conductive line of the second RDL structure and the TDV structure.

11. The die stack of claim 10, wherein the third semiconductor die is a non-TSV die.

12. The die stack of claim 11, wherein the first semiconductor die is electrically connected to a fourth semiconductor die by the TDV structure.

13. The die stack of claim 1, wherein:
the second semiconductor die is electrically connected to the first semiconductor die by a first connection circuit that includes the conductive line of the second RDL structure and the TDV structure; and
the third semiconductor die is electrically connected to the first semiconductor die by a third connection circuit that includes a conductive line of the second RDL structure and the TDV structure.

14. A system on integrated circuit (SoIC) structure comprising a die stack comprising:
a first semiconductor die comprising a first semiconductor substrate;
a first redistribution layer (RDL) structure disposed on a front surface of the first semiconductor die and electrically connected to the first semiconductor substrate;
a second semiconductor die bonded to the front surface of the first semiconductor die and comprising a second semiconductor substrate;
a third semiconductor die bonded to the front surface of the first semiconductor die and comprising a third semiconductor substrate;
a second RDL structure disposed on front surfaces of the second semiconductor die and the third semiconductor die, wherein the second RDL structure is electrically connected to the second semiconductor substrate and the third semiconductor substrate;
a fourth semiconductor die bonded to the front surfaces of the second semiconductor die and the third semiconductor die, wherein the fourth semiconductor die comprises a fourth semiconductor substrate;
a through dielectric via (TDV) structure extending between the second semiconductor die and the third semiconductor die, wherein the TDV structure directly electrically connects the first RDL structure and the second RDL structure; and
a second bonding structure comprising:
a discontinuous second frontside bonding layer having a first portion that is bonded directly to the front surface of the second semiconductor die and a separate second portion that is bonded directly to the front surface of the third semiconductor die; and
a continuous second backside bonding layer bonded to the second and third semiconductor dies by the second frontside bonding layer and to a back surface of the fourth semiconductor die; and
a logic die bonded to the die stack and comprising a logic die semiconductor substrate comprising logic circuitry, wherein the second RDL structure comprises:
a conductive line that extends within the second backside bonding layer; and
second bonding pads that extend through the second frontside bonding layer to bond and directly electrically connect a bonding pad of the second semiconductor die and a bonding pad of the third semiconductor die to the conductive line, and
wherein the second semiconductor die and the third semiconductor die are disposed in a plane that extends perpendicular to a vertical stacking direction of the die stack.

15. The SoIC structure of claim 14, wherein:
the second semiconductor die comprises a through silicon via (TSV) structure that extends through the second semiconductor substrate and electrically contacts the first RDL structure; and
the third semiconductor die is electrically connected to the first semiconductor die by a second connection circuit that includes the conductive line of the second RDL structure, the TSV structure of the second semiconductor die, and a conductive line of the first RDL structure.

16. The SoIC structure of claim 15, wherein the first semiconductor die and the third semiconductor die are non-TSV dies.

17. The SoIC structure of claim 14, wherein:
the second semiconductor die comprises a through silicon via (TSV) structure that extends through the second semiconductor substrate and electrically contacts to the first RDL structure; and
the third semiconductor die is electrically connected to the first semiconductor die by a first connection circuit that includes the conductive line of the second RDL structure and the TDV structure,
wherein the first semiconductor die is electrically connected to the logic die by the TDV structure and a TSV structure of the fourth semiconductor die.

18. The SoIC structure of claim 14, wherein the first semiconductor die, the second semiconductor die, and the fourth semiconductor die each comprise a memory die.

19. A system on integrated circuit (SoIC) structure comprising a die stack comprising:
a first semiconductor die comprising a first semiconductor substrate comprising a memory array;
a first redistribution layer (RDL) structure disposed on a front surface of the first semiconductor die and electrically connected to the first semiconductor substrate;
a second semiconductor die bonded to the front surface of the first semiconductor die and comprising a second semiconductor substrate comprising a memory array;
a third semiconductor die bonded to the front surface of the first semiconductor die and comprising a third semiconductor substrate comprising a memory array;
a second RDL structure disposed on front surfaces of the second semiconductor die and third semiconductor die and electrically connecting the second semiconductor substrate and third semiconductor substrate;
a fourth semiconductor die bonded to the front surfaces of the second semiconductor die and third semiconductor die and comprising a fourth semiconductor substrate comprising a memory array;
a through dielectric via (TDV) structure extending between the second semiconductor die and third semiconductor die and electrically connecting the first semiconductor die and the fourth semiconductor die; and
a second bonding structure comprising:
a discontinuous second frontside bonding layer having a first portion that is bonded directly to the front surface of the second semiconductor die and a separate second portion that is bonded directly to third semiconductor die; and a continuous second backside bonding layer bonded to the second and third semiconductor dies by the second frontside bonding layer and to a rear surface of the fourth semiconductor die; and a logic die bonded to the die stack and comprising a logic die semiconductor substrate comprising logic circuitry, wherein the second RDL structure comprises:

a conductive line that extends within the second backside bonding layer; and second bonding pads that extend through the second frontside bonding layer to bond and directly electrically connect a bonding pad of the second semiconductor die and a bonding pad of the third semiconductor die to the conductive line, and wherein the second semiconductor die and third semiconductor die are disposed in a plane that extends perpendicular to a vertical stacking direction of the die stack.

20. The SoIC structure of claim 19, wherein the third semiconductor die is electrically connected to the first semiconductor die by the TDV structure.

* * * * *